United States Patent
Zirath

[19]

[11] Patent Number: 6,097,247
[45] Date of Patent: Aug. 1, 2000

[54] LOW THRESHOLD VOLTAGE DIODE-CONNECTED FET

[75] Inventor: Herbert Zirath, Mölndal, Sweden

[73] Assignee: Telefonaktiebolaget LM Ericsson, Stockholm, Sweden

[21] Appl. No.: 09/161,231

[22] Filed: Sep. 28, 1998

[30] Foreign Application Priority Data

Sep. 29, 1997 [SE] Sweden .................................. 9703506

[51] Int. Cl.⁷ ........................................................ H03D 1/10
[52] U.S. Cl. .......................... 329/364; 257/402; 326/34; 326/36; 329/365; 455/330; 455/333
[58] Field of Search ....................................... 329/364, 365, 329/366; 455/330, 333; 326/31, 34, 36; 257/402

[56] References Cited

U.S. PATENT DOCUMENTS

| | | | |
|---|---|---|---|
| 4,410,902 | 10/1983 | Malik | 257/498 |
| 4,418,292 | 11/1983 | Cserhalmi et al. | 326/23 |
| 4,839,709 | 6/1989 | Zurakowski | 329/370 |
| 5,298,807 | 3/1994 | Salmon et al. | 326/68 |
| 5,339,272 | 8/1994 | Tedrow et al. | 365/189.09 |
| 5,475,245 | 12/1995 | Kudo et al. | 257/288 |
| 5,550,699 | 8/1996 | Diaz | 361/56 |
| 5,805,500 | 9/1998 | Campardo et al. | 365/185.2 |

FOREIGN PATENT DOCUMENTS

| | | |
|---|---|---|
| 0 694 971 | 1/1996 | European Pat. Off. . |
| 2 248 320 | 4/1992 | United Kingdom . |
| 2 248 326 | 4/1992 | United Kingdom . |
| 2 259 376 | 3/1993 | United Kingdom . |

*Primary Examiner*—Siegfried H. Grimm
*Attorney, Agent, or Firm*—Burns, Doane, Swecker & Mathis, L.L.P.

[57] ABSTRACT

A diode device with a low or negligible threshold voltage includes at least one field effect transistor, the gate of the field effect transistor being connected to the drain of the field effect transistor. The threshold voltage of the diode device is approximately of the same magnitude as the potential of the gate of the field effect transistor forming part of the diode device.

13 Claims, 3 Drawing Sheets

LOW THRESHOLD VOLTAGE DIODE-CONNECTED FET

This application claims priority under 35 U.S.C. §§119 and/or 365 to 9703506-7 filed in Sweden on Sep. 29, 1997; the entire content of which is hereby incorporated by reference.

TECHNICAL FIELD

The present invention relates to a diode device with an extremely low or negligible threshold voltage.

BACKGROUND

Diodes are standard components in, for example, mixers and detectors, in particular within the microwave and millimeter ranges. A diode conducts current essentially in only one direction, and this takes place if the voltage to which the diode is subjected in this direction exceeds a given value. The value at which a diode starts to conduct current is called the threshold voltage of the diode.

The fact that a diode starts to conduct current only at a given voltage means that a given minimum power will be consumed simply for the circuit of which the diode forms part to function. It is, of course, desirable to reduce this power to the greatest possible extent.

A number of different solutions for reducing the threshold voltage in a diode are previously known. Such a solution is described in U.S. Pat. No. 4 839 709. This solution may be considered to provide a semiconductor structure that is especially optimized for diodes and is not directly compatible with a semiconductor structure that might include active components, which may be said to be a disadvantage.

U.S. Pat. No. 4 410 902 describes a diode with a low threshold voltage, intended primarily for mixer circuits. This diode construction also appears to provide a semiconductor structure that is not directly compatible with active components. Furthermore, the solution appears to give an asymmetrical so-called current-voltage characteristic, which may also be a disadvantage as it can lead to the generation of undesirable odd harmonic multiples of the mixer frequency.

SUMMARY

The problem that is solved by means of the invention is that of producing a diode that has a low or negligible threshold voltage, where the process for production of the semiconductor structure that is used in the diode can also be used for production of semiconductor structures for analogue or digital circuits, for example transistors.

By means of the invention, moreover, a diode device is obtained that is less temperature-sensitive than the majority of previously known diodes.

These problems are solved by use of a field effect transistor (FET), suitably a GaAs MESFET (Gallium Arsenide MEtal Semiconductor FET), the active n-channel layer of which is of such a thickness that the so-called threshold voltage of the field effect transistor is essentially equal to zero. So as to bring about a diode function, the gate of the FET is connected to the drain, preferably via a resistor. The FET is suitably a so-called enhancement FET, which means that its threshold voltage is positive.

By means of the invention, a diode device is produced that also has a considerably much lower temperature sensitivity than most previously known diode types.

The device produced in the manner described above can advantageously be used in applications where diodes with a low threshold voltage are required. Two such applications that may be mentioned are mixer circuits and detector circuits.

A number of previously known publications describe field effect transistors where a gate is connected to a drain. U.S. Pat. No. 5 550 699 and GB 2 248 320 may be mentioned as examples of such specifications. However, these and other previously known applications of field effect transistors connected in this way relate to solving an essentially different problem to that of the present invention, previously known applications relating in fact to obtaining a circuit across which there is a constant potential difference.

DESCRIPTION OF THE DRAWINGS

The invention will be described in greater detail below with the aid of examples of embodiments and the appended drawings, in which.

DETAILED DESCRIPTION

Figure 1:
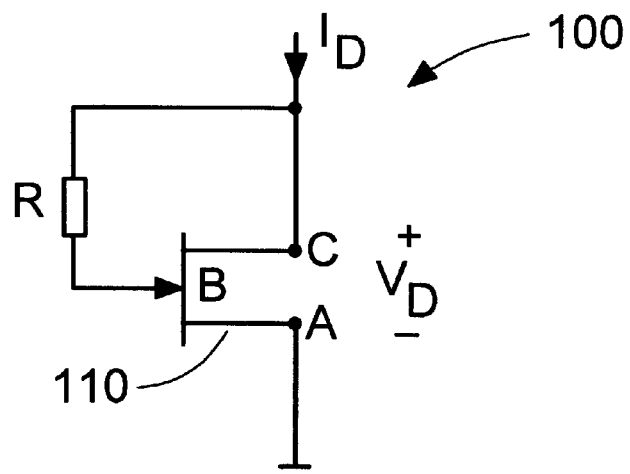
FIG. 1 shows an FET connected according to the invention.

FIG. 1 shows a diode device 100 according to the invention. The diode device 100 consists of an FET 110, suitably a GaAs MESFET, GaAs HEMT (High Electron Mobility Transistor) or InP (indium phosphide) HEMT, in which the drain (point C) is connected to the gate (point B), preferably via a resistor R. The resistor R should be dimensioned so that the current in the gate is limited, while taking account of the frequency at which it is possible in practice to use the FET 110, the so-called cut-off frequency.

Figure 2A:
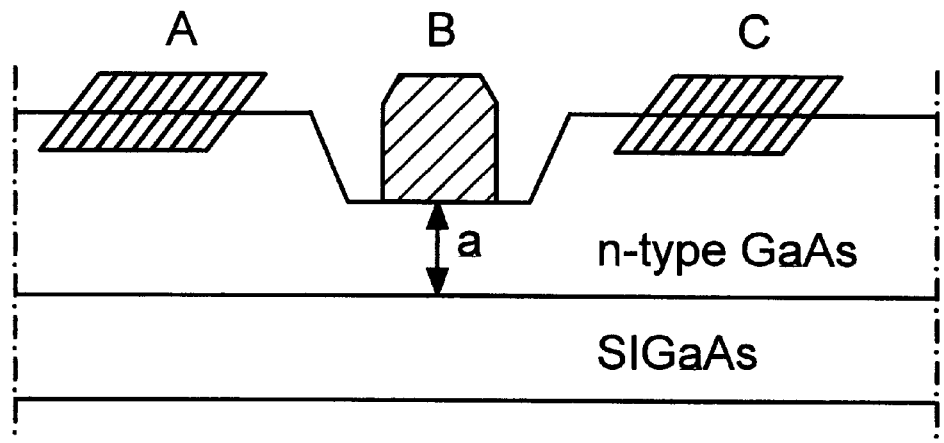
FIG. 2a shows in lateral cross-section a view of the structure of a GaAs FET.

The threshold voltage, $V_{th}$, in the FET is defined as the voltage that must be applied to the gate in order that current will not flow between the drain and the source. According to the invention, $V_{th}$ in the FET is essentially equal to zero, which can preferably be achieved by the active n-channel layer in the FET, in other words the doped GaAs layer under the gate, being given a thickness that gives rise to the necessary threshold voltage. FIG. 2a shows in lateral cross-section a view of the structure of an FET, where the active n-channel layer has been indicated by the letter a. Under the GaAs layer, there is a SIGaAs substrate.

Suitable dimensioning of the thickness, a, of the active n-channel layer in the FET can be achieved by the thickness a being made essentially equal to the thickness obtained by the mathematical expression $(2\epsilon V_{bi}/qN_d)^{1/2}$, where $\epsilon$ is the dielectric constant of the semiconductor, $V_{bi}$ is the drop in potential across the gate of the field effect transistor, q is the electron charge and $N_d$ is the doping concentration in the active n-channel layer in the FET.

$V_{bi}$ is defined as the potential that arises when a metal is applied to a semiconductor, which is the case, for example, in the gate in an FET.

Figure 2B:
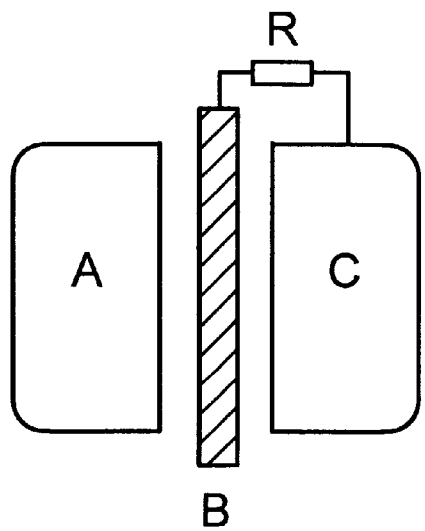
FIG. 2b shows in a cross-section in the plane of the paper a view from above of the structure of a GaAs FET according to the invention.
Figure 3:
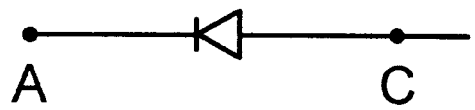
FIG. 3 shows the diode device obtained according to the invention.

FIG. 2b shows a diagrammatic cross-section from above in the plane of the paper of the arrangement according to the invention, and FIG. 3 symbolically shows the resulting diode function.

Figure 4:
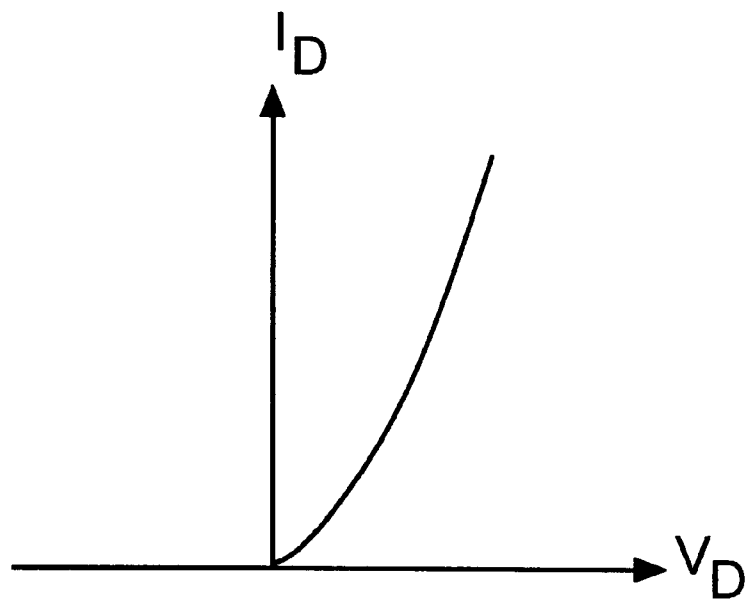
FIG. 4 shows a typical current-voltage characteristic obtained according to the invention.

FIG. 4 shows the current-voltage characteristic that is obtained with a diode device according to the invention. As can be seen in FIG. 4, the diode device according to the invention conducts current already at a very low or negligible voltage.

Figure 5:
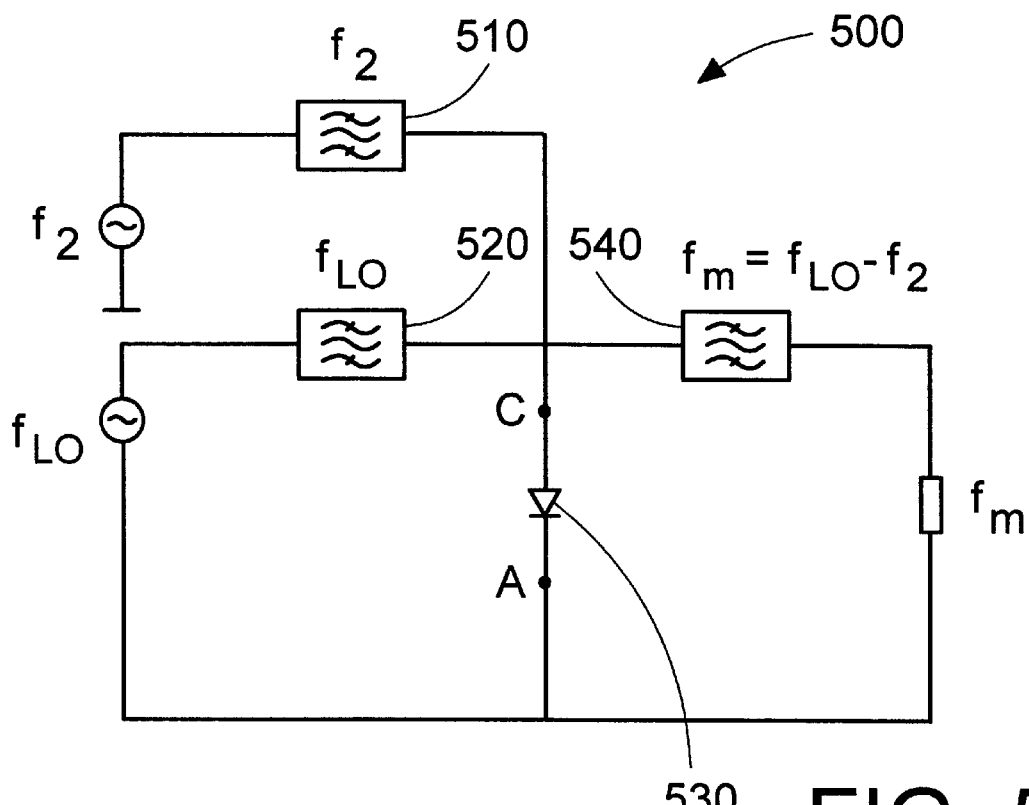
FIG. 5 shows an example of a mixer circuit of which a diode device according to the invention forms part.
Figure 6:
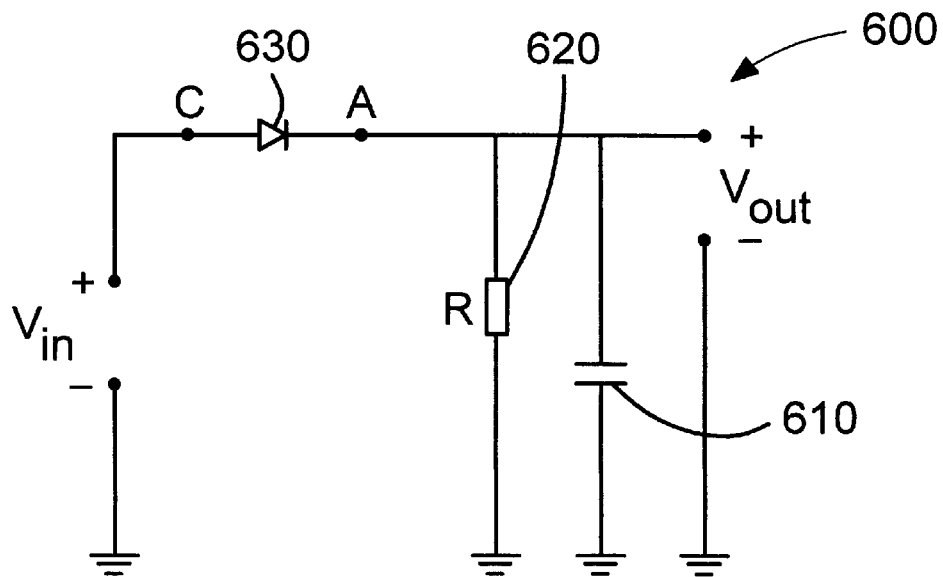
FIG. 6 shows an example of a detector circuit of which a diode device according to the invention forms part.

The diode device according to the invention is mainly used, as has emerged, in applications where the same function as a diode is desired, but with a very low or negligible threshold voltage. FIGS. 5 and 6 show two such applications.

FIG. 5 shows a mixer circuit 500. A first frequency $f_{LO}$ from a local oscillator and a second frequency $f_2$ are each applied via respective bandpass filters 520, 510 to a diode device 530 according to the invention. Via a third bandpass filter 540, a resulting frequency, $f_m$, is then obtained at a measurement port, which in the circuit shown is $f_m = f_{LO} - f_2$.

If the circuit 500 in FIG. 5 had been made using a conventional diode, it would have been necessary for one signal, usually the local oscillator as this is the stronger signal in most cases, to have a given amplitude in order for the diode to conduct, and for the mixer to function accordingly. On account of the low or negligible threshold voltage of the diode device according to the invention, a mixer circuit has been obtained that conducts current at very small amplitudes of the input signals. In other words, the mixer circuit now has, with the aid of a diode device according to the invention, increased sensitivity and reduced power consumption.

FIG. 6 shows a detector circuit intended to detect the amplitude of an AC voltage, $v_{in}$, in, for example, a measurement object. The detector circuit 600 consists of a diode device 630 according to the invention and also an RC circuit, in other words a resistor 620 and a capacitor 610. The voltage change of the detector is measured via the RC circuit. If a conventional diode had been used in the circuit 600, it would not have been possible to register the voltage change caused by the forward-biased voltage drop across the diode. On account of the fact that the diode device 630 according to the invention has a low or negligible threshold voltage, extremely small voltage changes can be registered with the aid of this circuit 600.

The invention is not limited to the examples of embodiments described above and shown in the drawings, but may be varied freely within the scope of the patent claims below. The applications shown above, a mixer circuit and a detector, are merely examples of applications. The invention can also be applied in other applications where a diode function with a low or negligible threshold voltage is required.

What is claimed is:

1. Frequency mixer comprising at least one diode device, wherein the diode device comprises a field effect transistor, the gate of the field effect transistor being connected to the drain of the field effect transistor, whereby the diode device has a low or negligible threshold voltage.

2. Frequency mixer according to claim 1, wherein the gate of the filed effect transistor forming part of the diode device is connected to the drain of the field effect transistor via a resistor.

3. Frequency mixer according to claim 1, wherein the threshold voltage for the diode device is approximately equal to zero.

4. Frequency mixer according to claim 1, wherein the field effect transistor of the diode device has an active n-channel layer whose thickness is approximately equal to $(2\epsilon V_{bi}/qN_d)^{1/2}$, where $\epsilon$ is the dielectric constant of the semiconductor, $V_{bi}$ is the potential drop across the gate of the field effect transistor, q is the electron charge, and $N_d$ is the doping concentration in the active n-channel layer.

5. Frequency mixer according to claim 1, wherein the field effect transistor of the diode device is a gallium arsenide MESFET transistor.

6. Signal detector comprising at least one diode device, wherein the diode device comprises a field effect transistor, the gate of the field effect transistor being connected to the drain of the field effect transistor, whereby the diode device has a low or negligible threshold voltage.

7. Signal detector according to claim 6, wherein the gate of the field effect transistor is connected to the drain of the field effect transistor via a resistor.

8. Signal detector according to claim 6, wherein the threshold voltage of the diode device is approximately equal to zero.

9. Signal detector according to claim 6, wherein the field effect transistor forming part of the diode device has an active n-channel layer of which the thickness is approximately equal to $(2\epsilon V_{bi}/qN_d)^{1/2}$, where $\epsilon$ is the dielectric constant of the semiconductor, $V_{bi}$ is the potential drop across the gate of the field effect transistor, q is the electron charge, and $N_d$ is the doping concentration in the active n-channel layer.

10. Signal detector according to claim 6, wherein the field effect transistor forming part of the diode device is a gallium arsenide MESFET transistor.

11. Diode device with a low or negligible threshold voltage, comprising at least one field effect transistor, the gate of the field effect transistor being connected to the drain of the field effect transistor, wherein the threshold voltage of the diode device is approximately of the same magnitude as the potential of the gate of the field effect transistor forming part of the diode device and wherein the threshold voltage of the diode device is made approximately equal to zero by the active n-channel layer of the field effect transistor forming part of the diode device being approximately equal to $(2\epsilon V_{bi}/qN_d)^{1/2}$, where $\epsilon$ is the dielectric constant of the semiconductor, $V_{bi}$ is the potential drop across the gate of the field effect transistor, q is the electron charge, and $N_d$ is the doping concentration in the active n-channel layer.

12. Diode device with a low or negligible threshold voltage, comprising at least one field effect transistor, the gate of the field effect transistor being connected to the drain of the field effect transistor, wherein the threshold voltage of the diode device is approximately of the same magnitude as the potential of the gate of the field effect transistor forming part of the diode device and wherein the gate of the field effect transistor forming part of the diode device is connected to the drain of the field effect transistor via a resistor.

13. Diode device according to claim 12, wherein the field effect transistor forming part of the diode device is a gallium arsenide MESFET transistor.

* * * * *